United States Patent
Yang (10) Patent No.: US 12,348,124 B2
(45) Date of Patent: Jul. 1, 2025

(54) BOOTSTRAP DEVICE AND BUCK-BOOST CONVERTER

(71) Applicant: ELITE SEMICONDUCTOR MICROELECTRONICS TECHNOLOGY INC., Hsinchu (TW)

(72) Inventor: Yao-Wei Yang, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 89 days.

(21) Appl. No.: 18/485,333

(22) Filed: Oct. 12, 2023

(65) Prior Publication Data

US 2025/0125712 A1    Apr. 17, 2025

(51) Int. Cl.
*H02M 1/15* (2006.01)
*H02M 1/08* (2006.01)
*H02M 3/158* (2006.01)
*H03K 17/06* (2006.01)

(52) U.S. Cl.
CPC ........... *H02M 1/08* (2013.01); *H02M 3/1582* (2013.01); *H03K 17/063* (2013.01)

(58) Field of Classification Search
None
See application file for complete search history.

(56) References Cited

U.S. PATENT DOCUMENTS

| | | | | |
|---|---|---|---|---|
| 7,848,125 B2 * | 12/2010 | Miller | ..................... | G11C 5/005 363/59 |
| 10,079,538 B2 * | 9/2018 | Zhao | ..................... | H02M 3/1582 |
| 10,491,112 B2 * | 11/2019 | Li | ..................... | H02M 1/08 |
| 11,394,380 B2 | 7/2022 | Kaufmann et al. | | |
| 12,051,976 B2 * | 7/2024 | Singh | ..................... | H02M 1/08 |
| 2019/0326817 A1 * | 10/2019 | Zhang | ..................... | H02M 1/08 |

FOREIGN PATENT DOCUMENTS

CN           113556036 A      10/2021

* cited by examiner

Primary Examiner — Thomas J. Hiltunen (57) ABSTRACT

A bootstrap device used for first and second transistors of a buck-boost converter includes first and second bootstrap circuits. The first bootstrap circuit generates a first bootstrap voltage, and determines, based on a change among a first switching voltage, a voltage level of a source terminal of the first transistor and the first bootstrap voltage, whether to charge according to at least one of a DC input voltage, a DC output voltage, and a second bootstrap voltage. The second bootstrap circuit generates the second bootstrap voltage, and determines, based on a change among a second switching voltage, a voltage level of a source terminal of the second transistor, and the second bootstrap voltage, whether to charge according to at least one of the DC input voltage, the DC output voltage, and the first bootstrap voltage. The bootstrap device improves charging efficiency of bootstrap capacitors.

18 Claims, 4 Drawing Sheets

BOOTSTRAP DEVICE AND BUCK-BOOST CONVERTER

BACKGROUND OF THE INVENTION

1. Field of the Invention

The present disclosure relates to a device and a converter, and in particular to a bootstrap device and a buck-boost converter.

2. Description of the Related Art

Figure 1:
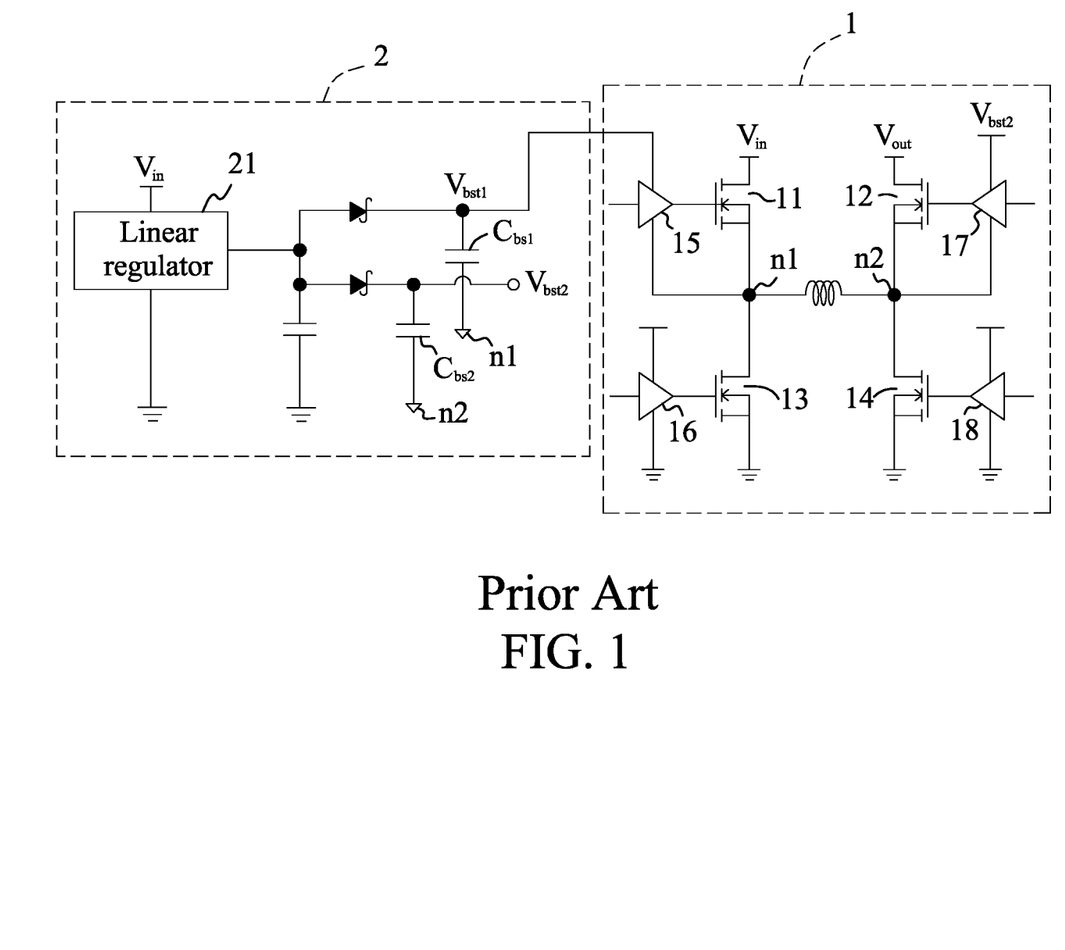
FIG. 1 is a circuit block diagram for illustrating a bootstrap device used for a conventional buck-boost converter of the prior art.

Referring to FIG. 1, a conventional buck-boost converter 1 includes four transistors 11, 12, 13, and 14, and four pre-drivers 15, 16, 17, and 18. When the buck-boost converter 1 operates in a buck mode, the transistors 11 and 13 are respectively controlled by the pre-drivers 15 and 16 and thus switch between on and off, the transistor 12 is controlled by the pre-driver 17 and is continuously on, and the transistor 14 is controlled by the pre-driver 18 and is continuously off. When the buck-boost converter 1 operates in a boost mode, the transistor 11 is controlled by the pre-driver 15 and is continuously on, the transistor 13 is controlled by the pre-driver 16 and is continuously off, and the transistors 12 and 14 are respectively controlled by the pre-drivers 17 and 18 and thus switch between on and off.

During operation of the buck mode or the boost mode, drain voltages of the transistors 11 and 12 are respectively an input voltage $V_{in}$ and an output voltage $V_{out}$, which are high voltages in circuits. If it is desired that the transistors 11 and 12 be fully on during operation, each of the transistors 11 and 12 needs to have sufficient gate and source voltages; that is, the gate and source voltages of each of the transistors 11 and 12 need to be higher than the drain voltages thereof. Thus, bootstrap voltages $V_{bst1}$ and $V_{bst2}$ higher than the drain voltages need to be prepared and be supplied to the pre-drivers 15 and 17, such that sizes of voltages of control signals that the pre-drivers 15 and 17 generate to control and turn on the transistors 11 and 12 are higher than the corresponding drain voltages. A bootstrap device 2 is used to generate the bootstrap voltages $V_{bst1}$ and $V_{bst2}$, as shown in FIG. 1.

A conventional bootstrap device 2 includes a linear regulator 21 that generates a regulated voltage, two bootstrap capacitors $C_{bs1}$ and $C_{bs2}$, and other components. The bootstrap capacitor $C_{bs1}$ has a first terminal for providing the bootstrap voltage $V_{bst1}$, and a second terminal coupled to a source terminal n1 of the transistor 11. The bootstrap capacitor $C_{bs2}$ has a first terminal for providing the bootstrap voltage $V_{bst2}$, and a second terminal coupled to a source terminal n2 of the transistor 12. When the buck-boost converter 1 operates in the buck mode, the bootstrap capacitor $C_{bs2}$ needs to receive and be charged by a current of the regulated voltage from the linear regulator 21, so as to continuously provide the bootstrap voltage $V_{bst2}$ sufficient for the pre-driver 17 to control the transistor 12 to be continuously on. However, since the second terminal of the bootstrap capacitor $C_{bs2}$ is coupled to the source terminal n2 of the transistor 12, in the buck mode, a voltage at the source terminal n2 of the transistor 12 is equal to the output voltage $V_{out}$, and a voltage at the first terminal of the bootstrap capacitor $C_{bs2}$ (that is, the bootstrap voltage $V_{bst2}$) is clamped to a first voltage level $V_{out'}$ (that is, at this point, $V_{bst2}=V_{out'}=V_{cbs2}+V_{out}$, where $V_{cbs2}$ represents a cross voltage of the bootstrap capacitor $C_{bs2}$). As a result, an external control circuit needs to be used to periodically pull down the voltage at the source terminal n2 of the transistor 12, so as to return the voltage at the first terminal of the bootstrap capacitor $C_{bst2}$ clamped at the voltage level $V_{out'}$ back to the original bootstrap voltage $V_{bst2}$ (at this point, the voltage at the first terminal of the bootstrap capacitor $C_{bs2}$ is less than the voltage level $V_{out'}$, that is, $V_{bst2}<V_{out'}$). Once the regulated voltage ($V_{LVDD}$) generated by the linear regulator 21 is greater than the voltage at the first terminal of the bootstrap capacitor $C_{bs2}$ (that is, $V_{LVDD}>V_{bst2}$), the bootstrap capacitor $C_{bs2}$ can then receive and be charged by the current of the regulated voltage from the linear regulator 21. Similarly, when the buck-boost converter 1 operates in the boost mode, an external control circuit is also needed to periodically pull down the voltage at the source terminal n1 of the transistor 11, so as to return the voltage at the first terminal of the bootstrap capacitor $C_{bs1}$ clamped at a voltage level ($V_{in}$) of the input voltage $V_{in}$ to the original bootstrap voltage $V_{bst1}$. Once the regulated voltage ($V_{LVDD}$) generated by the linear regulator 21 is greater than the voltage at the first terminal of the bootstrap capacitor $C_{bs1}$ (that is, $V_{LVDD}>V_{bst1}$), the bootstrap capacitor $C_{bs1}$ can then receive and be charged by the current of the regulated voltage from the linear regulator 21, hence continuously providing the bootstrap voltage $V_{bst1}$ sufficient for the pre-driver 15 to control the transistor 11 to be continuously on. Therefore, the conventional bootstrap device 2 is incapable of efficiently providing the bootstrap capacitors $C_{bs1}$ and $C_{bs2}$ with charging currents.

BRIEF SUMMARY OF THE INVENTION

Therefore, it is an object of the present disclosure to provide a bootstrap device capable of more efficiently charging bootstrap capacitors, so as to solve the issues of the prior art, in which charging is performed only after a voltage at one terminal of a bootstrap capacitor is first pulled down by an external control circuit and the resulted poor charging efficiency of such conventional bootstrap device for bootstrap capacitors.

A bootstrap device of the present disclosure is suitable for a buck-boost converter, which generates a direct-current (DC) output voltage based on a DC input voltage and includes a first transistor and a second transistor serving as upper switches. The bootstrap device includes a first bootstrap circuit and a second bootstrap circuit.

The first bootstrap circuit is configured to generate a first bootstrap voltage to control a gate voltage of the first transistor to be greater than a first reference voltage, receives the DC input voltage, the DC output voltage, and a second bootstrap voltage, and is coupled to a source terminal of the first transistor. The first bootstrap circuit determines, according to whether a change in a voltage difference among a first switching voltage, a voltage level of the source terminal of the first transistor, and the first bootstrap voltage is greater than a first threshold voltage, whether to charge according to at least one of the DC input voltage, the DC output voltage, and a second bootstrap voltage, such that the first bootstrap voltage is kept appropriate to control the gate voltage of the first transistor to be greater than the first reference voltage.

The second bootstrap circuit receives the DC input voltage and the DC output voltage, and is coupled to the first bootstrap circuit to receive the first bootstrap voltage and coupled to a source terminal of the second transistor. The second bootstrap circuit is configured to generate the second bootstrap voltage to control a gate voltage of the second transistor to be greater than a second reference voltage, and outputs the second bootstrap voltage to the first bootstrap circuit. The second bootstrap circuit determines, according to whether a change in a voltage difference among a second switching voltage, a voltage level of the source terminal of the second transistor, and the second bootstrap voltage is greater than a second threshold voltage, whether to charge according to at least one of the DC input voltage, the DC output voltage and the first bootstrap voltage, such that the second bootstrap voltage is kept appropriate to control the gate voltage of the second transistor to be greater than the second reference voltage.

A buck-boost converter of the present disclosure includes first to fourth transistors, the bootstrap device described above, and a pre-driving circuit.

The first transistor has a drain terminal for receiving the DC input voltage, a source terminal, and a gate terminal. The second transistor has a drain terminal for outputting the DC output voltage, a source terminal, and a gate terminal. The third transistor has a drain terminal coupled to the source terminal of the first transistor, a source terminal connected to ground, and a gate terminal. The fourth transistor has a drain terminal coupled to the source terminal of the second transistor, a source terminal connected to ground, and a gate terminal.

The pre-driving circuit is coupled to the gate terminals of the first to fourth transistors, and is configured to control the first to fourth transistors to be on or off. The pre-driving circuit is further coupled to the bootstrap device to receive the first and second bootstrap voltages, controls, based on the first bootstrap voltage, the gate voltage of the first transistor to be greater than the first reference voltage, and controls, based on the second bootstrap voltage, the gate voltage of the second transistor to be greater than the second reference voltage.

The effects of the present disclosure are as follows. The first bootstrap circuit can quickly determine, according to whether a change in a voltage difference among the first switching voltage, the voltage level of the source terminal of the first transistor, and the first bootstrap voltage is greater than a threshold voltage, whether to charge according to at least one of the DC input voltage, the DC output voltage, and the second bootstrap voltage. Moreover, the second bootstrap circuit can quickly determine, according to whether a change in a voltage difference among the second switching voltage, the voltage level of the source terminal of the second transistor, and the second bootstrap voltage is greater than the threshold voltage, whether to charge according to at least one of the DC input voltage, the DC output voltage and, the first bootstrap voltage. Thus, an additional external control circuit for periodically pulling down the voltage at the source terminal of a transistor as in a conventional bootstrap device is not needed before charging of bootstrap capacitors can be performed, further enabling the bootstrap device of the present disclosure to more efficiently charge bootstrap capacitors.

DETAILED DESCRIPTION OF THE INVENTION

In the following description of the present disclosure, details of the present disclosure are given by way of the embodiments with reference to the accompanying drawings, so as to help a person skilled in the art to better understand the objects, features, and effects of the present disclosure. It should be noted that some terms are used throughout the description of the present disclosure to refer to specific components. It is generally understood by a person skilled in the art that different names may be used by manufacturers to refer to certain components. In the description below and the appended claims, the terms "include" and "comprise" are used in the sense of an open manner, and are not to be construed as closed terms such as "consisting of . . . ". Moreover, the term "couple" is intended to represent an indirect or direct electrical connection. Thus, if one apparatus is coupled to another apparatus, the connection in between can be implemented by a direct electrical connection or be implemented by an indirect electrical connection achieved with another apparatus in between. Moreover, in the description of the present disclosure, terms such as "first", "second", and "third" are used to distinguish differences among elements, and are not to be construed as limiting to the elements themselves and specific orders of the elements.

Figure 2:
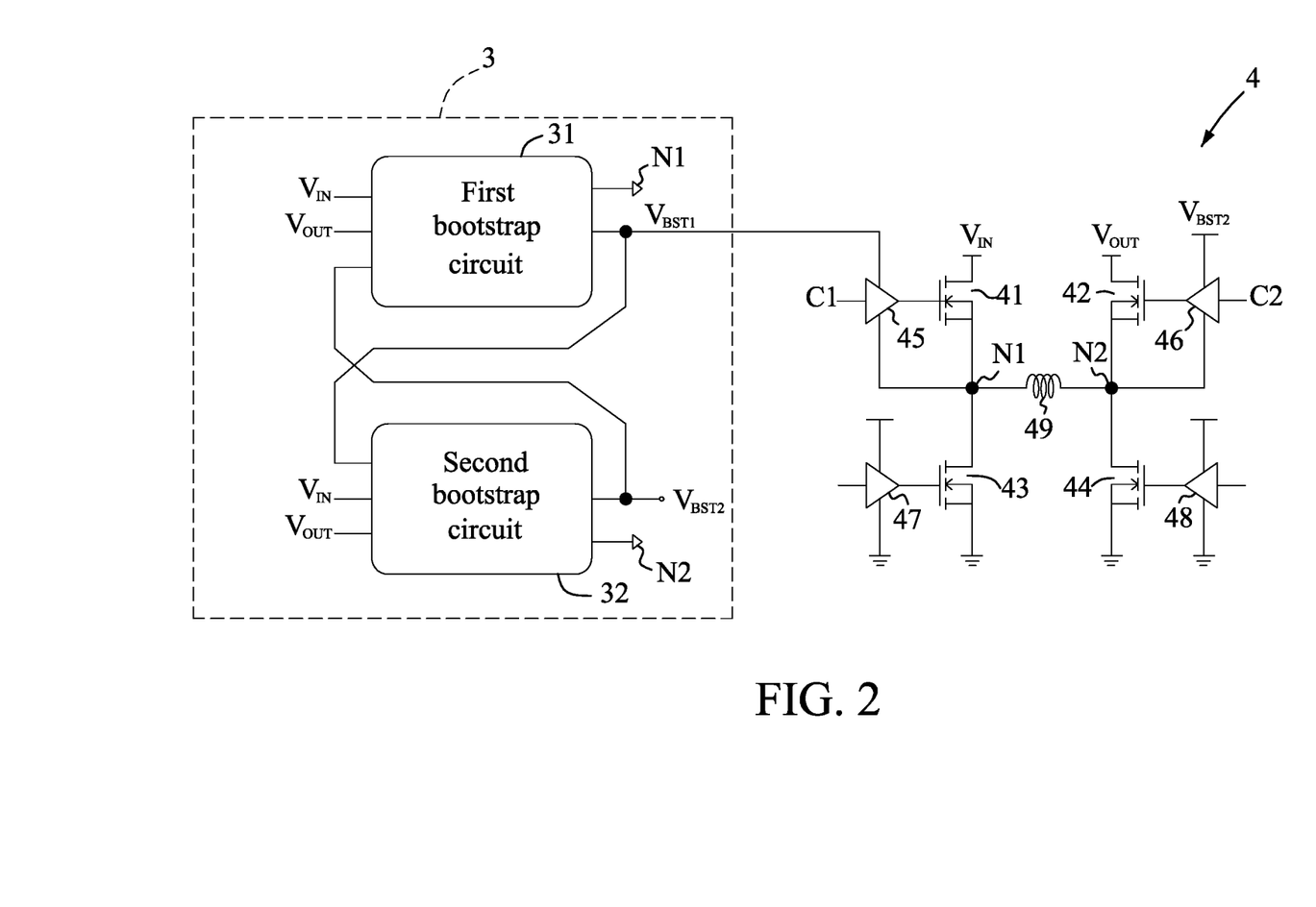
FIG. 2 is a circuit block diagram for illustrating a buck-boost converter applying the bootstrap device according to an embodiment of the present disclosure.

Referring to FIG. 2, a buck-boost converter 4 including a bootstrap device 3 of the present disclosure is described below. The buck-boost converter 4 generates a direct-current (DC) output voltage $V_{OUT}$ based on a DC input voltage $V_{IN}$. The buck-boost converter 4 further includes first to fourth transistors 41, 42, 43, and 44, first to fourth pre-drivers 45, 46, 47, and 48, and an inductor 49. The first to fourth pre-drivers 45, 46, 47 and 48 serve as a pre-driving circuit. The buck-boost converter 4 is operable in a buck mode, a boost mode, and a buck-boost mode. The operation of the buck-boost converter 4 are the same as those of the buck-boost converter 1 (referring to FIG. 1) and is generally known to a person skilled in the art, and is thus omitted herein. The bootstrap device 3 generates first and second bootstrap voltages $V_{BST1}$ and $V_{BST2}$ for boosting voltage levels of gate terminals of the first and second transistors 41 and 42.

The first transistor 41 has a drain terminal for receiving the DC input voltage $V_{IN}$, a source terminal N1, and a gate terminal. The second transistor 42 has a drain terminal for receiving the DC output voltage $V_{OUT}$, a source terminal N2, and a gate terminal. The third transistor 43 has a drain terminal coupled to the source terminal N1 of the first transistor 41, a source terminal connected to ground, and a gate terminal. The fourth transistor 44 has a drain terminal coupled to the source terminal N2 of the second transistor 42, a source terminal connected to ground, and a gate terminal. In an embodiment, each of the first to fourth transistors 41, 42, 43, and 44 is an N-type metal oxide semiconductor field effect transistor (MOSFET). The first and second transistors 41 and 42 serve as upper side switches, and the third and fourth transistors 43 and 44 serve as lower side switches. The inductor 49 is coupled between the source terminal N1 of the first transistor 41 and the source terminal N2 of the second transistor 42.

Output terminals of the first to fourth pre-drivers 45, 46, 47, and 48 are respectively coupled to the gate terminals of the first to fourth transistors 41, 42, 43, and 44, and are configured to control the first to fourth transistors 41, 42, 43, and 44 to be on or off according to an operation mode (that is, the buck mode, the boost mode, or the buck-boost mode) of the buck-boost converter 4. The first pre-driver 45 receives an external control signal C1, and is further coupled to the bootstrap device 3 to receive the first bootstrap voltage $V_{BST1}$ and coupled to the source terminal N1 of the first transistor 41. The first pre-driver 45 adjusts a gate voltage of the first transistor 41 (that is, increasing a voltage level of the gate terminal of the first transistor 41) according to the external control signal C1, the first bootstrap voltage $V_{BST1}$, and a source voltage of the first transistor 41, so as to control the gate voltage of the first transistor 41 to be continuously greater than a first reference voltage (that is, a sum of the source voltage of the first transistor 41 and a first threshold voltage) when the buck-boost converter 4 operates in the boost mode, such that the first transistor 41 is controlled by the first pre-driver 45 and is continuously turned on. The second pre-driver 46 adjusts a gate voltage of the second transistor 42 (that is, increasing a voltage level of the gate terminal of the second transistor 42) according to the external control signal C2, the second bootstrap voltage $V_{BST2}$, and a source voltage of the second transistor 42, so as to control the gate voltage of the second transistor 42 to be continuously greater than a second reference voltage (that is, a sum of the source voltage of the second transistor 42 and a second threshold voltage) when the buck-boost converter 4 operates in the buck mode, such that the second transistor 42 is controlled by the second pre-driver 46 and is continuously turned on.

It should be noted that, the present disclosure focuses on how the bootstrap device 3 more efficiently and continuously provides the stable first and second bootstrap voltages $V_{BST1}$ and $V_{BST2}$ for respectively increasing the voltages levels of the gate terminals of the first and second transistors 41 and 42, so as to solve the issues of the prior art. Thus, details of the configuration of the first to fourth pre-drivers 45, 46, 47, and 48 and the details of the operation of the first to fourth transistors 41, 42, 43, and 44 switching from on to off are generally known to a person skilled in the art, and are omitted herein. It should be noted that, the bootstrap device 3 disclosed by the present disclosure is not limited to being applied to such as the buck-boost converter 4 shown in FIG. 2.

The bootstrap device 3 includes a first bootstrap circuit 31 and a second bootstrap circuit 32.

The first bootstrap circuit 31 is configured to generate the first bootstrap voltage $V_{BST1}$ to control the gate voltage of the first transistor 41 to be greater than the first reference voltage, receives the DC input voltage $V_{IN}$, the DC output voltage $V_{OUT}$, and the second bootstrap voltage $V_{BST2}$, and is coupled to the source terminal N1 of the first transistor 41. The first bootstrap circuit 31 determines, according to whether a change in a voltage difference among a first switching voltage $V_{S1}$, a voltage level of the source terminal N1 of the first transistor 41 and the first bootstrap voltage $V_{BST1}$ is greater than a threshold voltage Vt of a bootstrap transistor 310; and whether to charge according to at least one of the DC input voltage $V_{IN}$, the DC output voltage $V_{OUT}$, and the second bootstrap voltage $V_{BST2}$, such that the first bootstrap voltage $V_{BST1}$ is kept appropriate to control the gate voltage of the first transistor 41 to be greater than the first reference voltage. It should be noted that, the first bootstrap voltage $V_{BST1}$ gradually decreases along with the turning on of the first transistor 41, so the first bootstrap capacitor 31 needs to be charged so as to keep the first bootstrap voltage $V_{BST1}$ at a certain voltage.

The second bootstrap circuit 32 receives the DC input voltage $V_{IN}$ and the DC output voltage $V_{OUT}$, and is coupled to the first bootstrap circuit 31 to receive the first bootstrap voltage $V_{BST1}$ and coupled to the source terminal N2 of the second transistor 42. The second bootstrap circuit 32 is configured to generate the second bootstrap voltage $V_{BST2}$ to control the gate voltage of the second transistor 42 to be greater than a second reference voltage, and outputs the second bootstrap voltage $V_{BST2}$ to the first bootstrap circuit 31. The second bootstrap circuit 32 determines, according to whether a change in a voltage difference among a second switching voltage $V_{S2}$, a voltage level of the source terminal N2 of the second transistor 42, and the second bootstrap voltage $V_{BST2}$ is greater than the threshold voltage Vt of a bootstrap transistor 320; and whether to charge according to at least one of the DC input voltage $V_{IN}$, the DC output voltage $V_{OUT}$ and the first bootstrap voltage $V_{BST1}$, such that the second bootstrap voltage $V_{BST2}$ is kept appropriate to control the gate voltage of the second transistor 42 to be greater than the second reference voltage. It should be noted that, the second bootstrap voltage $V_{BST2}$ gradually decreases along with the turning on of the second transistor 42, so the second bootstrap capacitor 32 needs to be charged so as to keep the second bootstrap voltage $V_{BST2}$ at a certain voltage.

Figure 3:
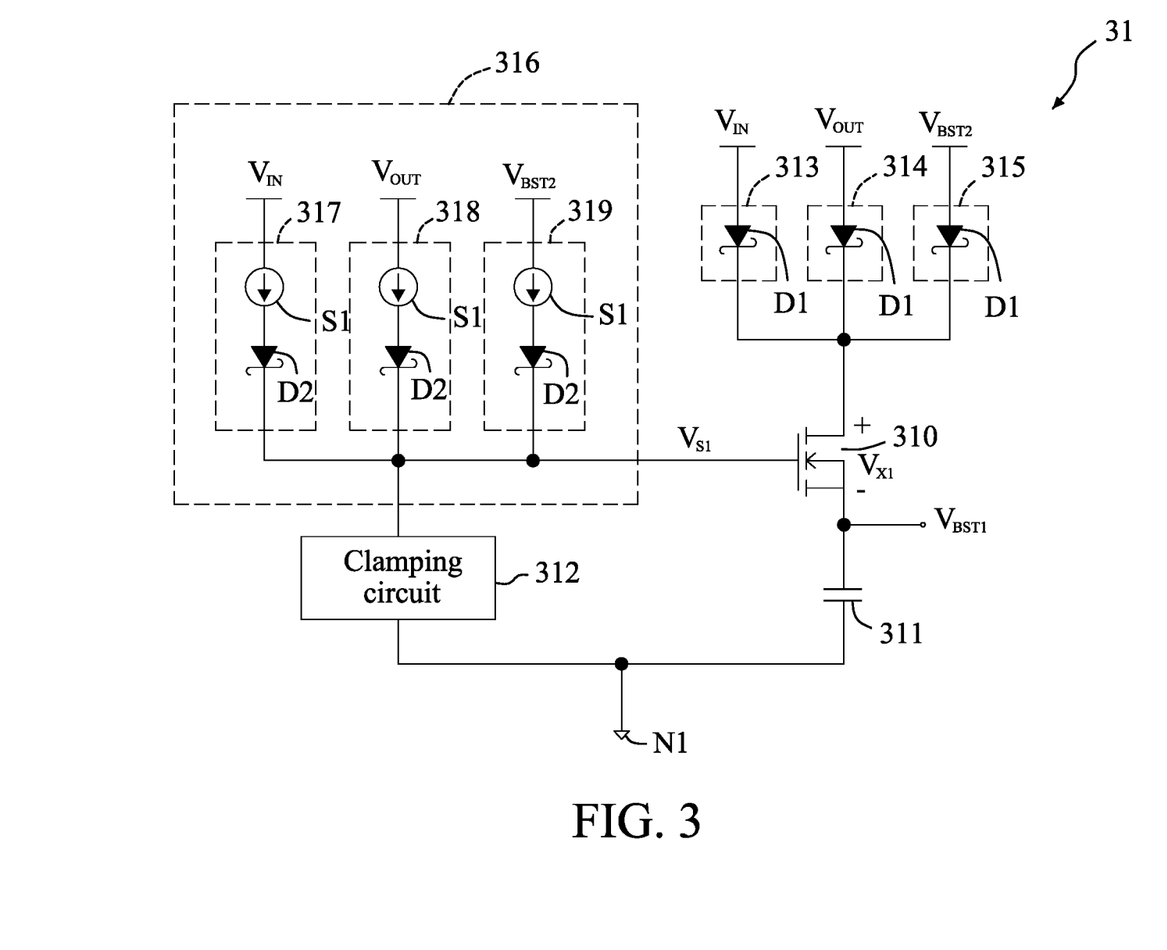
FIG. 3 is a circuit block diagram for illustrating a first bootstrap circuit of an embodiment of the present disclosure.

Refer to FIG. 3 showing a schematic diagram of the first bootstrap circuit 31 according to an embodiment of the present disclosure. The first bootstrap circuit 31 includes a bootstrap transistor 310, a bootstrap capacitor 311, a clamping circuit 312, first to third charging circuits 313, 314, and 315, and a driving unit 316.

The bootstrap transistor 310 has a first terminal, a second terminal outputting the first bootstrap voltage $V_{BST1}$, and a control terminal. A voltage level of the control terminal of the bootstrap transistor 310 serves as the first switching voltage $V_{S1}$. The bootstrap transistor 310 is an N-type MOSFET, wherein a drain, a source, and a gate respectively serve as the first terminal, the second terminal, and the control terminal of the bootstrap transistor 310. The bootstrap transistor 311 is coupled between the second terminal of the bootstrap transistor 310 and the source terminal N1 of the first transistor 41. The first bootstrap voltage $V_{BST1}$ is a floating voltage.

The clamping circuit 312 is coupled between the control terminal of the bootstrap transistor 310 and a second terminal of the bootstrap capacitor 311. The clamping circuit 312 is configured to maintain a potential difference between the second terminal of the bootstrap capacitor 311 and the control terminal of the bootstrap transistor 310. Moreover, a voltage at the second terminal of the bootstrap capacitor 311 is a non-constant value, and as a result, the first switching voltage $V_{S1}$ is a floating voltage. More specifically, the clamping circuit 312 can be a product generally known to a person skilled in the art of the present disclosure. For example, the clamping circuit 312 can include multiple clamping transistors, wherein each of the multiple clamping transistors is implemented by a transistor in the form of a diode. For example, a gate terminal and a drain terminal of each of the multiple clamping transistors are coupled to each other, and the multiple clamping circuits are connected in series with one another.

The first charging circuit 313 is configured to receive the DC input voltage $V_{IN}$, is coupled to the first terminal of the bootstrap transistor 310, and can generate and output a first charging current based on the DC input voltage $V_{IN}$ to the first terminal of the bootstrap transistor 310. The second charging circuit 314 is configured to receive the DC output voltage $V_{OUT}$, is coupled to the first terminal of the bootstrap transistor 310, and can generate and output a second charging current based on the DC output voltage $V_{OUT}$ to the first terminal of the bootstrap transistor 310. The third charging circuit 315 is configured to receive the second bootstrap voltage $V_{BST2}$, is coupled to the first terminal of the bootstrap transistor 310, and can generate and output a third charging current based on the second bootstrap voltage $V_{BST2}$ to the first terminal of the bootstrap transistor 310. In an embodiment, each of the first to third charging circuits 313, 314, and 315, for example but not limited to, has a Schottky diode D1. In each of the first to third charging circuits 313, 314, and 315, an anode of the Schottky diode D1 is configured to receive a corresponding one of the DC input voltage $V_{IN}$, the DC output voltage $V_{OUT}$, and the second bootstrap voltage $V_{BST2}$, and a cathode of the Schottky diode D1 is coupled to the first terminal of the bootstrap transistor 310.

The driving unit 316 is coupled to the control terminal of the bootstrap transistor 310, and is configured to receive the DC input voltage $V_{IN}$, the DC output voltage $V_{OUT}$, and the second bootstrap voltage $V_{BST2}$, and to accordingly provide a driving current to the control terminal of the bootstrap transistor 310. The driving unit 316 includes first to third driving circuits 317, 318, and 319. The first to third driving circuits 317, 318, and 319 respectively receive the DC input voltage $V_{IN}$, the DC output voltage $V_{OUT}$, and the second bootstrap voltage $V_{BST2}$, and the first to third driving circuits 317, 318 and 319 are coupled to the control terminal of the bootstrap transistor 310. Each of the first to third driving circuits 317, 318 and 319 has a current source S1 and a Schottky diode D2 connected in series. In each of the first to third driving circuits 317, 318, and 319, the current source S1 is configured to receive a corresponding one of the DC input voltage $V_{IN}$, the DC output voltage $V_{OUT}$, and the second bootstrap voltage $V_{BST2}$. Anodes of the Schottky diodes D2 are coupled to the current source S1, and cathodes of the Schottky diodes D2 are coupled to the control terminal of the bootstrap transistor 310.

According to the first bootstrap circuit 31 disclosed in an embodiment, the bootstrap capacitor 311 can be charged in the following state: when a difference of subtracting a voltage value V1 by a voltage value V2 is greater than a threshold voltage Vt of the bootstrap transistor 310 (that is, V1−V2>Vt), the bootstrap transistor 310 is turned on, wherein the voltage value V1 is obtained by subtracting the first switching voltage $V_{S1}$ by the voltage level of the source terminal N1 of the first transistor 41, and the voltage value V2 is obtained by subtracting the first bootstrap voltage $V_{BST1}$ by the voltage level of the source terminal N1 of the first transistor 41. At this point, when a value of the DC input voltage $V_{IN}$ subtracted by a cross voltage $V_{D1}$ of the corresponding Schottky diode D1 and subtracted by a drain-source cross voltage $V_{X1}$ of the bootstrap transistor 310 is greater than the first bootstrap voltage $V_{BST1}$ (that is, $V_{IN}-V_{D1}-V_{X1}>V_{BST1}$), the first charging current charges the bootstrap capacitor 311; when a value of the DC output voltage $V_{OUT}$ subtracted by the cross voltage $V_{D1}$ of the corresponding Schottky diode D1 and subtracted by the drain-source cross voltage $V_{X1}$ of the bootstrap transistor 310 is greater than the first bootstrap voltage $V_{BST1}$ (that is, $V_{OUT}-V_{D1}-V_{X1}>V_{BST1}$), the second charging current charges the bootstrap capacitor 311; when a value of the second bootstrap voltage $V_{BST2}$ subtracted by the cross voltage $V_{D1}$ of the corresponding Schottky diode D1 and subtracted by the drain-source cross voltage $V_{X1}$ of the bootstrap transistor 310 is greater than the first bootstrap voltage $V_{BST1}$ (that is, $V_{BST2}-V_{D1}-V_{X1}>V_{BST1}$), the third charging current charges the bootstrap capacitor 311. Thus, the first bootstrap voltage $V_{BST1}$ can be maintained at an appropriate level to control the gate voltage of the first transistor 41 to be greater than the first reference voltage.

Figure 4:
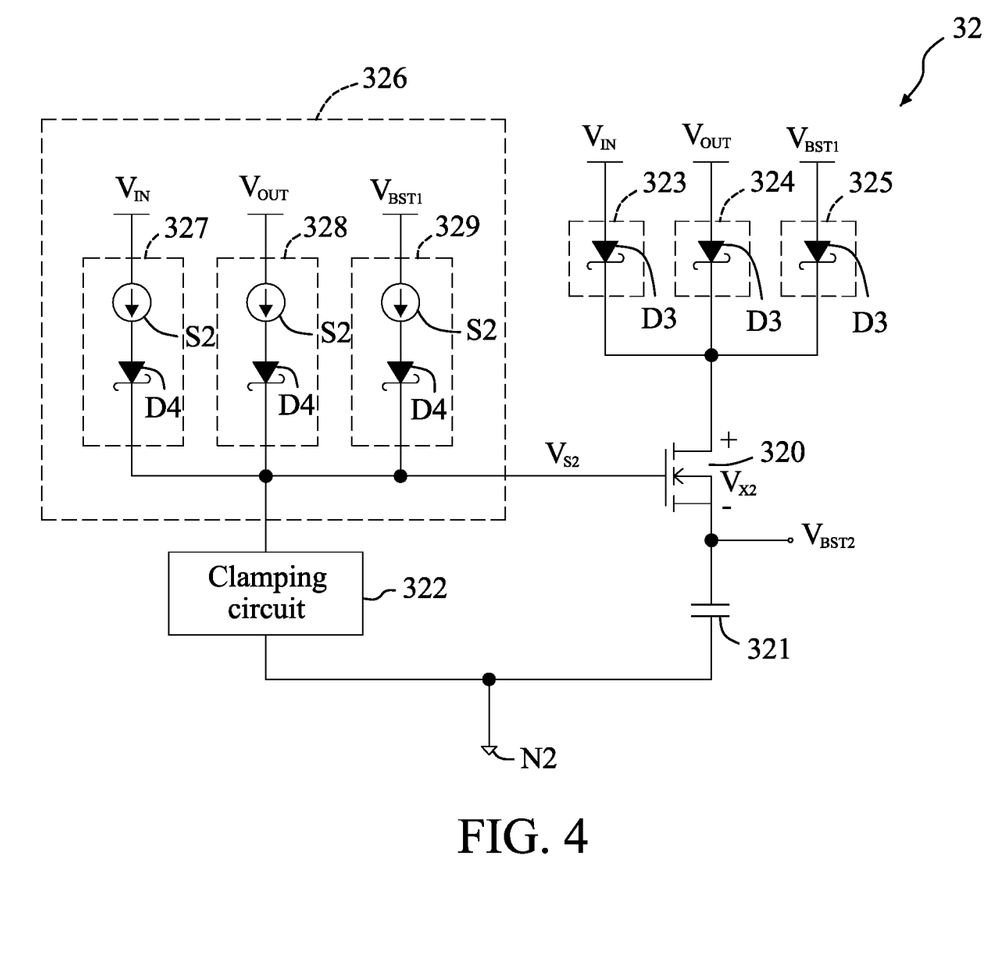
FIG. 4 is a circuit block diagram for illustrating a second bootstrap circuit of an embodiment of the present disclosure.

Refer to FIG. 4 showing a schematic diagram of the second bootstrap circuit 32 according to an embodiment of the present disclosure. The second bootstrap circuit 32 includes the bootstrap transistor 320, a bootstrap capacitor 321, a clamping circuit 322, first to third charging circuits 323, 324, and 325, and a driving unit 326.

The bootstrap transistor 320 has a first terminal, a second terminal outputting the second bootstrap voltage $V_{BST2}$, and a control terminal. A voltage level of the control terminal of the bootstrap transistor 320 serves as the second switching voltage $V_{S2}$. The bootstrap transistor 320 is an N-type MOSFET, wherein a drain, a source, and a gate respectively serve as the first terminal, the second terminal, and the control terminal of the bootstrap transistor 320. The bootstrap transistor 321 is coupled between the second terminal of the bootstrap transistor 320 and the source terminal N2 of the second transistor 42. The second bootstrap voltage $V_{BST2}$ is a floating voltage.

The clamping circuit 322 is coupled between the control terminal of the bootstrap transistor 320 and a second terminal of the bootstrap capacitor 321. The clamping circuit 322 is configured to maintain a potential difference between the second terminal of the bootstrap capacitor 321 and the control terminal of the bootstrap transistor 320. Moreover, a voltage at the second terminal of the bootstrap capacitor 321 is a non-constant value, and as a result, the second switching voltage $V_{S2}$ is a floating voltage. More specifically, the clamping circuit 322 can be a product generally known to a person skilled in the art of the present disclosure, and for example, can include multiple clamping transistors, wherein each of the multiple clamping transistors is implemented by a transistor in the form of a diode. For example, a gate terminal and a drain terminal of each of the multiple clamping transistors are coupled to each other, and the multiple clamping circuits are connected in series with one another.

The first charging circuit 323 is configured to receive the DC input voltage $V_{IN}$, is coupled to the first terminal of the bootstrap transistor 320, and can generate and output another first charging current based on the DC input voltage $V_{IN}$ to the first terminal of the bootstrap transistor 320. The second charging circuit 324 is configured to receive the DC output voltage $V_{OUT}$, is coupled to the first terminal of the bootstrap transistor 320, and can generate and output another second charging current based on the DC output voltage $V_{OUT}$ to the first terminal of the bootstrap transistor 320. The third charging circuit 325 is configured to receive the first bootstrap voltage $V_{BST1}$, is coupled to the first terminal of the bootstrap transistor 320, and can generate and output another third charging current based on the first bootstrap voltage $V_{BST1}$ to the first terminal of the bootstrap transistor 320. In an embodiment, each of the first to third charging circuits 323, 324, and 325, for example but not limited to, has a Schottky diode D3. In each of the first to third charging circuits 323, 324, and 325, an anode of the Schottky diode D3 is configured to receive a corresponding one of the DC input voltage $V_{IN}$, the DC output voltage $V_{OUT}$ and the second bootstrap voltage $V_{BST1}$, and a cathode of the Schottky diode D3 is coupled to the first terminal of the bootstrap transistor 320.

The driving unit 326 is coupled to the control terminal of the bootstrap transistor 320, and is configured to receive the DC input voltage $V_{IN}$, the DC output voltage $V_{OUT}$, and the first bootstrap voltage $V_{BST1}$, and provides a driving current to the control terminal of the bootstrap transistor 320 accordingly. The driving unit 326 includes first to third driving circuits 327, 328, and 329. The first to third driving circuits 327, 328, and 329 respectively receive the DC input voltage $V_{IN}$, the DC output voltage $V_{OUT}$, and the first bootstrap voltage $V_{BST1}$, and the first to third driving circuits 327, 328, and 329 are coupled to the control terminal of the bootstrap transistor 320. Each of the first to third driving circuits 327, 328, and 329 has a current source S2 and a Schottky diode D4 connected in series. In each of the first to third driving circuits 327, 328, and 329, the current source S2 is configured to receive a corresponding one of the DC input voltage $V_{IN}$, the DC output voltage $V_{OUT}$, and the first bootstrap voltage $V_{BST1}$. Anodes of the Schottky diodes D4 are coupled to the current source S2, and cathodes of the Schottky diodes D4 are coupled to the control terminal of the bootstrap transistor 320.

According to the second bootstrap circuit 32 disclosed in an embodiment, the bootstrap capacitor 321 can be charged in the following state: when a difference of subtracting a voltage value V3 by a voltage value V4 is greater than a threshold voltage Vt of the bootstrap transistor 320 (that is, V3-V4>Vt), the bootstrap transistor 320 is turned on, wherein the voltage value V3 is obtained by subtracting the second switching voltage $V_{S2}$ by the voltage level of the source terminal N2 of the second transistor 42, and the voltage value V4 is obtained by subtracting the second bootstrap voltage $V_{BST2}$ by the voltage level of the source terminal N2 of the second transistor 42. At this point, when a value of the DC input voltage $V_{IN}$ subtracted by a cross voltage $V_{D3}$ of the corresponding Schottky diode D3 and subtracted by a drain-source cross voltage $V_{X2}$ of the bootstrap transistor 320 is greater than the second bootstrap voltage $V_{BST2}$ (that is, $V_{IN}-V_{D3}-V_{X2}>V_{BST2}$), the another first charging current charges the bootstrap capacitor 321; when a value of the DC output voltage $V_{OUT}$ subtracted by the cross voltage $V_{D3}$ of the corresponding Schottky diode D3 and subtracted by the drain-source cross voltage $V_{X2}$ of the bootstrap transistor 320 is greater than the second bootstrap voltage $V_{BST2}$ (that is, $V_{OUT}-V_{D3}-V_{X2}>V_{BST2}$), the another second charging current charges the bootstrap capacitor 321; when a value the first bootstrap voltage $V_{BST1}$ subtracted by the cross voltage $V_{D3}$ of the corresponding Schottky diode D3 and subtracted by the drain-source cross voltage $V_{X2}$ of the bootstrap transistor 320 is greater than the second bootstrap voltage $V_{BST2}$ (that is, $V_{BST2}-V_{D3}-V_{X2}>V_{BST2}$), the another third charging current charges the bootstrap capacitor 321. Thus, the second bootstrap voltage $V_{BST2}$ can be maintained at an appropriate level to control the gate voltage of the second transistor 42 to be greater than the second reference voltage.

In conclusion, the bootstrap device 3 of the present disclosure is capable of determining at all times, based on a change in the voltage difference among the first switching voltage $V_{S1}$, the voltage level of the source terminal N1 of the first transistor 41 and the first bootstrap voltage $V_{BST1}$, whether to charge the bootstrap capacitor 311 according to at least one of the DC input voltage $V_{IN}$, the DC output voltage $V_{OUT}$, and the second bootstrap voltage $V_{BST2}$, and is capable of determining at all times, based on a change in the voltage difference among the second switching voltage $V_{S2}$, the voltage level of the source terminal N2 of the second transistor 42 and the second bootstrap voltage $V_{BST2}$, whether to charge the bootstrap capacitor 321 according to at least one of the DC input voltage $V_{IN}$, the DC output voltage $V_{OUT}$ and the first bootstrap voltage $V_{BST1}$. Thus, an additional external control circuit for periodically pulling down the voltage at the source terminal of a transistor as in a conventional bootstrap device is not needed before charging of bootstrap capacitors can be performed. As such, the bootstrap device 3 of the present disclosure improves charging efficiency of the bootstrap capacitors 311 and 321. Moreover, the first bootstrap circuit 31 provides the first bootstrap voltage $V_{BST1}$ to the second bootstrap circuit 32, and the second bootstrap circuit 32 provides the second bootstrap voltage $V_{BST2}$ to the first bootstrap circuit 31. Thus, the bootstrap device 3 of the present disclosure further has a charge sharing mechanism and can be used to charge the bootstrap capacitors 311 and 321, such that the first and second bootstrap voltages $V_{BST1}$ and $V_{BST2}$ can be kept at certain voltages, further reducing charging failures of the bootstrap capacitors 311 and 321. Further, compared to a conventional bootstrap device, the bootstrap device 3 of the present disclosure has better charging capabilities.

The description above provides merely preferred embodiments of the present disclosure, and is not to be construed as limitations to the scope of implementation of the present invention. All simple and equivalent variations and modifications made based on the scope of claims and the description of the present disclosure are to be encompassed within the scope of the present disclosure.

What is claimed is:

1. A bootstrap device, suitable for a buck-boost converter which generates a direct-current (DC) output voltage based on a DC input voltage and includes a first transistor and a second transistor serving as upper switches, the bootstrap device comprising:
   a first bootstrap circuit, configured to generate a first bootstrap voltage and to receive the DC input voltage, the DC output voltage, and a second bootstrap voltage, and coupled to a source terminal of the first transistor, the first bootstrap circuit determining, according to whether a change in a voltage difference among a first switching voltage, a voltage level of the source terminal of the first transistor and the first bootstrap voltage is greater than a first threshold voltage, whether to charge according to at least one of the DC input voltage, the DC output voltage, and a second bootstrap voltage, such that the first bootstrap voltage is kept appropriate to control a gate voltage of the first transistor to be greater than a first reference voltage; and
   a second bootstrap circuit, configured to receive the DC input voltage and the DC output voltage, coupled to the first bootstrap circuit to receive the first bootstrap voltage, and coupled to a source terminal of the second transistor; the second bootstrap circuit further configured to generate the second bootstrap voltage and to output the second bootstrap voltage to the first bootstrap circuit, the second bootstrap circuit determining, according to whether a change in a voltage difference among a second switching voltage, a voltage level of the source terminal of the second transistor, and the second bootstrap voltage is greater than a second threshold voltage, whether to charge according to at least one of the DC input voltage, the DC output voltage, and the first bootstrap voltage, such that the second bootstrap voltage is kept appropriate to control a gate voltage of the second transistor to be greater than a second reference voltage.

2. The bootstrap device according to claim 1, wherein the first bootstrap circuit comprises:
- a bootstrap transistor, having a first terminal, a second terminal outputting the first bootstrap voltage, and a control terminal; a voltage level of the control terminal of the bootstrap transistor serving as the first switching voltage;
- a bootstrap transistor, coupled between the second terminal of the bootstrap transistor and the source terminal of the first transistor;
- a clamping circuit, coupled between the control terminal of the bootstrap transistor and a second terminal of a bootstrap capacitor, the clamping circuit configured to maintain a potential difference between the second terminal of the bootstrap capacitor and the control terminal of the bootstrap transistor;
- a first charging circuit, configured to receive the DC input voltage, coupled to the first terminal of the bootstrap transistor, and capable of generating and outputting a first charging current based on the DC input voltage to the first terminal of the bootstrap transistor;
- a second charging circuit, configured to receive the DC output voltage, coupled to the first terminal of the bootstrap transistor, and capable of generating and outputting a second charging current based on the DC output voltage to the first terminal of the bootstrap transistor;
- a third charging circuit, configured to receive the second bootstrap voltage, coupled to the first terminal of the bootstrap transistor, and capable of generating and outputting a third charging current based on the second bootstrap voltage to the first terminal of the bootstrap transistor; and
- a driving unit, coupled to the control terminal of the bootstrap transistor, and configured to receive the DC input voltage, the DC output voltage, and the second bootstrap voltage and to accordingly provide a driving current to the control terminal of the bootstrap transistor.

3. The bootstrap device according to claim 2, wherein each of the first to third charging circuits has a Schottky diode, an anode of the Schottky diode is configured to receive a corresponding one of the DC input voltage, the DC output voltage, and the second bootstrap voltage, and a cathode of the Schottky diode is coupled to the first terminal of the bootstrap transistor.

4. The bootstrap device according to claim 2, wherein the driving unit comprises first to third driving circuits, the first to third driving circuits respectively receive the DC input voltage, the DC output voltage, and the second bootstrap voltage, and the first to third driving circuits are coupled to the control terminal of the bootstrap transistor.

5. The bootstrap device according to claim 4, wherein each of the first to third charging circuits comprises a current source and a Schottky diode connected in series, the current source is configured to receive a corresponding one of the DC input voltage, the DC output voltage, and the second bootstrap voltage; an anode of the Schottky diode is coupled to the current source, and a cathode of the Schottky diode is coupled to the control terminal of the bootstrap transistor.

6. The bootstrap device according to claim 1, wherein the second bootstrap circuit comprises:
- a bootstrap transistor, having a first terminal, a second terminal outputting the second bootstrap voltage, and a control terminal; a voltage level of the control terminal of the bootstrap transistor serving as the second switching voltage;
- a bootstrap capacitor, coupled between the second terminal of the bootstrap transistor and the source terminal of the second transistor;
- a clamping circuit, coupled between the control terminal of the bootstrap transistor and a second terminal of the bootstrap capacitor; the clamping circuit configured to maintain a potential difference between the second terminal of the bootstrap capacitor and the control terminal of the bootstrap transistor;
- a first charging circuit, configured to receive the DC input voltage, coupled to the first terminal of the bootstrap transistor, and capable of generating and outputting a first charging current based on the DC input voltage to the first terminal of the bootstrap transistor;
- a second charging circuit, configured to receive the DC output voltage, coupled to the first terminal of the bootstrap transistor, and capable of generating and outputting a second charging current based on the DC output voltage to the first terminal of the bootstrap transistor;
- a third charging circuit, configured to receive the first bootstrap voltage, coupled to the first terminal of the bootstrap transistor, and capable of generating and outputting a third charging current based on the first bootstrap voltage to the first terminal of the bootstrap transistor; and
- a driving unit, coupled to the control terminal of the bootstrap transistor, and configured to receive the DC input voltage, the DC output voltage, and the first bootstrap voltage and to accordingly provide a driving current to the control terminal of the bootstrap transistor.

7. The bootstrap device according to claim 6, wherein each of the first to third charging circuits has a Schottky diode; an anode of the Schottky diode is configured to receive a corresponding one of the DC input voltage, the DC output voltage, and the first bootstrap voltage, and a cathode of the Schottky diode is coupled to the first terminal of the bootstrap transistor.

8. The bootstrap device according to claim 6, wherein the driving unit comprises first to third driving circuits, the first to third driving circuits respectively receive the DC input voltage, the DC output voltage, and the first bootstrap voltage, and the first to third driving circuits are coupled to the control terminal of the bootstrap transistor.

9. The bootstrap device according to claim 8, wherein each of the first to third driving circuits comprises a current source and a Schottky diode connected in series, the current source is configured to receive a corresponding one of the DC input voltage, the DC output voltage, and the first bootstrap voltage; an anode of the Schottky diode is coupled to the current source, and a cathode of the Schottky diode is coupled to the control terminal of the bootstrap transistor.

10. A buck-boost converter, comprising:
- a first transistor, having a drain terminal for receiving the DC input voltage, a source terminal, and a gate terminal;
- a second transistor, having a drain terminal for outputting the DC output voltage, a source terminal, and a gate terminal;
- a third transistor, having a drain terminal coupled to the source terminal of the first transistor, a source terminal connected to ground, and a gate terminal;
- a fourth transistor, having a drain terminal coupled to the source terminal of the second transistor, a source terminal connected to ground, and a gate terminal;
- the bootstrap device according to claim 1; and a pre-driving circuit, coupled to the gate terminals of the first to fourth transistors, configured to control the first to fourth transistors to be on or off, coupled to the bootstrap device to receive the first and second bootstrap voltages, controlling, based on the first bootstrap voltage, the gate voltage of the first transistor to be greater than the first reference voltage, and controlling, based on the second bootstrap voltage, the gate voltage of the second transistor to be greater than the second reference voltage.

11. The buck-boost converter according to claim 10, wherein the first bootstrap circuit comprises:
a bootstrap transistor, having a first terminal, a second terminal outputting the first bootstrap voltage, and a control terminal; a voltage level of the control terminal of the bootstrap transistor serving as the first switching voltage;
a bootstrap capacitor, coupled between the second terminal of the bootstrap transistor and the source terminal of the first transistor;
a clamping circuit, coupled between the control terminal of the bootstrap transistor and a second terminal of the bootstrap capacitor; the clamping circuit configured to maintain a potential difference between the second terminal of the bootstrap capacitor and the control terminal of the bootstrap transistor;
a first charging circuit, configured to receive the DC input voltage, coupled to the first terminal of the bootstrap transistor, and capable of generating and outputting a first charging current based on the DC input voltage to the first terminal of the bootstrap transistor;
a second charging circuit, configured to receive the DC output voltage, coupled to the first terminal of the bootstrap transistor, and capable of generating and outputting a second charging current based on the DC output voltage to the first terminal of the bootstrap transistor;
a third charging circuit, configured to receive the second bootstrap voltage, coupled to the first terminal of the bootstrap transistor, and capable of generating and outputting a third charging current based on the second bootstrap voltage to the first terminal of the bootstrap transistor; and
a driving unit, coupled to the control terminal of the bootstrap transistor, and configured to receive the DC input voltage, the DC output voltage, and the second bootstrap voltage and to accordingly provide a driving current to the control terminal of the bootstrap transistor.

12. The buck-boost converter according to claim 11, wherein each of the first to third charging circuits has a Schottky diode; an anode of the Schottky diode is configured to receive a corresponding one of the DC input voltage, the DC output voltage, and the second bootstrap voltage, and a cathode of the Schottky diode is coupled to the first terminal of the bootstrap transistor.

13. The bootstrap device according to claim 11, wherein the driving unit comprises first to third driving circuits, the first to third driving circuits respectively receive the DC input voltage, the DC output voltage, and the second bootstrap voltage, and the first to third driving circuits are coupled to the control terminal of the bootstrap transistor.

14. The buck-boost converter according to claim 13, wherein each of the first to third charging circuits comprises a current source and a Schottky diode connected in series, the current source is configured to receive a corresponding one of the DC input voltage, the DC output voltage, and the second bootstrap voltage; an anode of the Schottky diode is coupled to the current source, and a cathode of the Schottky diode is coupled to the control terminal of the bootstrap transistor.

15. The buck-boost converter according to claim 10, wherein the second bootstrap circuit comprises:
a bootstrap transistor, having a first terminal, a second terminal outputting the second bootstrap voltage, and a control terminal; a voltage level of the control terminal of the bootstrap transistor serving as the second switching voltage;
a bootstrap capacitor, coupled between the second terminal of the bootstrap transistor and the source terminal of the second transistor;
a clamping circuit, coupled between the control terminal of the bootstrap transistor and a second terminal of the bootstrap capacitor; the clamping circuit configured to maintain a potential difference between the second terminal of the bootstrap capacitor and the control terminal of the bootstrap transistor;
a first charging circuit, configured to receive the DC input voltage, coupled to the first terminal of the bootstrap transistor, and capable of generating and outputting a first charging current based on the DC input voltage to the first terminal of the bootstrap transistor;
a second charging circuit, configured to receive the DC output voltage, coupled to the first terminal of the bootstrap transistor, and capable of generating and outputting a second charging current based on the DC output voltage to the first terminal of the bootstrap transistor;
a third charging circuit, configured to receive the first bootstrap voltage, coupled to the first terminal of the bootstrap transistor, and capable of generating and outputting a third charging current based on the first bootstrap voltage to the first terminal of the bootstrap transistor; and
a driving unit, coupled to the control terminal of the bootstrap transistor, and configured to receive the DC input voltage, the DC output voltage and the first bootstrap voltage and to accordingly provide a driving current to the control terminal of the bootstrap transistor.

16. The buck-boost converter according to claim 15, wherein each of the first to third charging circuits has a Schottky diode; an anode of the Schottky diode is configured to receive a corresponding one of the DC input voltage, the DC output voltage, and the first bootstrap voltage, and a cathode of the Schottky diode is coupled to the first terminal of the bootstrap transistor.

17. The buck-boost converter according to claim 15, wherein the driving unit comprises first to third driving circuits; the first to third driving circuits respectively receive the DC input voltage, the DC output voltage, and the first bootstrap voltage, and the first to third driving circuits are coupled to the control terminal of the bootstrap transistor.

18. The buck-boost converter according to claim 17, wherein each of the first to third driving circuits comprises a current source and a Schottky diode connected in series, the current source is configured to receive a corresponding one of the DC input voltage, the DC output voltage, and the first bootstrap voltage; an anode of the Schottky diode is coupled to the current source, and a cathode of the Schottky diode is coupled to the control terminal of the bootstrap transistor.

* * * * *